(12) United States Patent
Lee et al.

(10) Patent No.: US 8,883,016 B2
(45) Date of Patent: Nov. 11, 2014

(54) CARRIER FOR MANUFACTURING PRINTED CIRCUIT BOARD, METHOD OF MANUFACTURING THE SAME AND METHOD OF MANUFACTURING PRINTED CIRCUIT BOARD USING THE SAME

(71) Applicant: Samsung Electro-Mechanics Co., Ltd., Suwon (KR)

(72) Inventors: Jae Joon Lee, Seongnam-si (KR); Jin Yong Ahn, Yongin-si (KR); Suk Hyeon Cho, Suwon (KR); Ki Hwan Kim, Yongin-si (KR); Seok Kyu Lee, Suwon (KR)

( * ) Notice: Subject to any disclaimer, the term of this patent is extended or adjusted under 35 U.S.C. 154(b) by 0 days.

(21) Appl. No.: 14/042,616

(22) Filed: Sep. 30, 2013

(65) Prior Publication Data
US 2014/0027047 A1    Jan. 30, 2014

Related U.S. Application Data

(62) Division of application No. 12/716,193, filed on Mar. 2, 2010, now Pat. No. 8,563,141.

(30) Foreign Application Priority Data

Jan. 7, 2010    (KR) .................. 10-2010-0001284

(51) Int. Cl.
| | |
|---|---|
| *H01B 13/00* | (2006.01) |
| *H05K 3/00* | (2006.01) |
| *B32B 15/00* | (2006.01) |
| *B32B 7/04* | (2006.01) |
| *H05K 3/20* | (2006.01) |

(52) U.S. Cl.
CPC ........ *H05K 3/007* (2013.01); *H05K 2201/0355* (2013.01); *H05K 3/205* (2013.01); *H05K 3/0097* (2013.01); *B32B 15/00* (2013.01); *B32B 7/04* (2013.01)
USPC ............. 216/13; 427/97.1; 427/97.2; 428/45; 428/57; 428/58; 428/76; 428/81; 428/577; 428/582

(58) Field of Classification Search
CPC .... B32B 15/016; B32B 15/04; B32B 15/043; B32B 15/14; B32B 15/092; B32B 15/20; B21B 1/46; B21J 1/04; B21D 28/06; B22D 5/005; B22D 7/00; A41G 1/00; A44G 7/003
USPC ......... 428/45, 57, 58, 76, 577, 578, 582, 580, 428/81; 216/13; 427/97.1, 97.2
See application file for complete search history.

(56) References Cited

U.S. PATENT DOCUMENTS 2,679,468 A * 5/1954 Pitman ............................ 428/57
2,861,911 A   11/1958 Martin et al.
(Continued)

FOREIGN PATENT DOCUMENTS

JP         62-252189         11/1987

OTHER PUBLICATIONS

Office Action from counterpart Japanese Patent Application No. 2010-048554, mailed Dec. 6, 2011, 2 pages.

*Primary Examiner* — Cathy Lam
(74) *Attorney, Agent, or Firm* — Bracewell & Giuliani LLP; Brad Y. Chin (57) ABSTRACT

Disclosed is a carrier for manufacturing a printed circuit board, which includes a first carrier including a first binder having a first opening and a first metal layer formed in the first opening of the first binder, and a second carrier, stacked with the first carrier and including a second binder having a second opening and a second metal layer which is formed in the second opening of the second binder and which partially overlaps with the first metal layer, so that the carrier is simply configured and the binders are formed not only on the lateral surfaces of the metal layers but also on the upper surfaces thereof, thus improving the reliability of bonding of the carrier at the periphery. A method of manufacturing the carrier and a method of manufacturing a printed circuit board using the carrier are also provided.

10 Claims, 8 Drawing Sheets

(56) References Cited

U.S. PATENT DOCUMENTS

| | | | |
|---|---|---|---|
| 3,762,028 A * | 10/1973 | Swearingen et al. | 228/116 |
| 5,259,110 A * | 11/1993 | Bross et al. | 29/830 |
| 5,350,637 A * | 9/1994 | Ketcham et al. | 428/539.5 |
| 5,505,321 A | 4/1996 | Caron et al. | |
| 6,579,626 B1 * | 6/2003 | Ottinger et al. | 428/626 |
| 6,931,204 B2 * | 8/2005 | Urata et al. | 392/441 |
| 7,222,421 B2 | 5/2007 | Nakamura | |
| 7,594,317 B2 | 9/2009 | Nakamura | |
| 7,716,826 B2 | 5/2010 | Nakamura | |
| 8,048,251 B2 | 11/2011 | Yamashita et al. | |
| 8,207,450 B2 | 6/2012 | An et al. | |
| 8,209,860 B2 | 7/2012 | An et al. | |
| 8,286,341 B2 | 10/2012 | Palm et al. | |
| 2009/0073670 A1 | 3/2009 | Hong et al. | |
| 2009/0283302 A1 | 11/2009 | Lee et al. | |
| 2010/0096171 A1 | 4/2010 | Lee et al. | |
| 2010/0126765 A1 | 5/2010 | Kim et al. | |
| 2011/0061906 A1 | 3/2011 | Cho et al. | |
| 2011/0138615 A1 | 6/2011 | Sohn et al. | |
| 2012/0231155 A1 | 9/2012 | An et al. | |
| 2012/0324723 A1 | 12/2012 | Hong et al. | |

* cited by examiner

FIG.1

Prior art

FIG.2

Prior art

FIG.3

Prior art

FIG.4

Prior art

FIG.5

Prior art

CARRIER FOR MANUFACTURING PRINTED CIRCUIT BOARD, METHOD OF MANUFACTURING THE SAME AND METHOD OF MANUFACTURING PRINTED CIRCUIT BOARD USING THE SAME

CROSS REFERENCE TO RELATED APPLICATIONS

The present patent application is a divisional application of U.S. patent application Ser. No. 12/716,193, filed Mar. 2, 2010, entitled "CARRIER FOR MANUFACTURING PRINTED CIRCUIT BOARD, METHOD OF MANUFACTURING THE SAME AND METHOD OF MANUFACTURING PRINTED CIRCUIT BOARD USING THE SAME," which claims priority to Korean Patent Application No. 10-2010-0001284, filed Jan. 7, 2010, entitled "A carrier for manufacturing a printed circuit board and a method of manufacturing the same and a method of manufacturing a printed circuit board using the same", which was incorporated by reference in its entirety into that application.

BACKGROUND OF THE INVENTION

1. Technical Field

The present invention relates to a carrier for manufacturing a printed circuit board (PCB), a method of manufacturing the same, and a method of manufacturing a PCB using the same.

2. Description of the Related Art

Typically, a PCB is manufactured by forming a copper wiring pattern on either or both surfaces of a board made of any type of thermosetting synthetic resin, mounting ICs or electronic components on the board with electrical connections therebetween, and encapsulating the board with an insulating material.

Alongside the recent advancement of the electronics industry is a drastically increasing demand for electronic components having increased functionality which are light, slim, short and small. A PCB which mounts such electronic components is also required to have a high-density wiring pattern and to be slim.

In particular, in order to respond to the reduction in the thickness of a PCB, a coreless substrate is receiving attention, which obviates a need for a core substrate and thus may reduce the total thickness of a PCB and may shorten signal processing time. However, the coreless substrate should include a carrier which serves as a support in the manufacturing process because a core substrate is not used.

FIGS. 1 to 5 sequentially show a process of manufacturing a PCB using a carrier according to a conventional technique. With reference to FIGS. 1 to 5, the method of manufacturing a PCB using a carrier is described infra.

Figure 1:
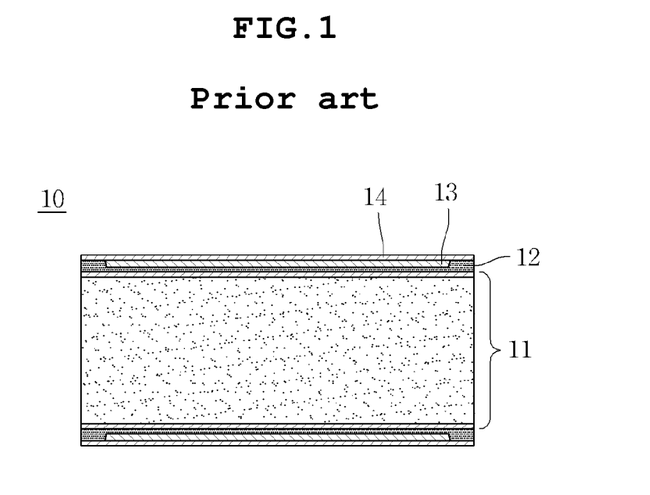
FIGS. 1 to 5 are cross-sectional views sequentially showing a process of manufacturing a PCB according to a conventional technique.

As shown in FIG. 1, a carrier 10 is prepared. Specifically, the carrier 10 is constructed such that an adhesive layer 12, a first metal layer 13 and a second metal layer are sequentially formed on both surfaces of a copper clad laminate 11 including an insulating layer and a copper foil layer formed on both surfaces of the insulating layer. As such, the carrier 10 is hot pressed using a high-temperature and high-pressure press, and thereby both ends of the adhesive layer 12 are adhered to the copper clad laminate 11 and the second metal layer 14. On the other hand, the first metal layer 13 is only in contact with the second metal layer 14, not being adhered to the second metal layer 14.

Figure 2:
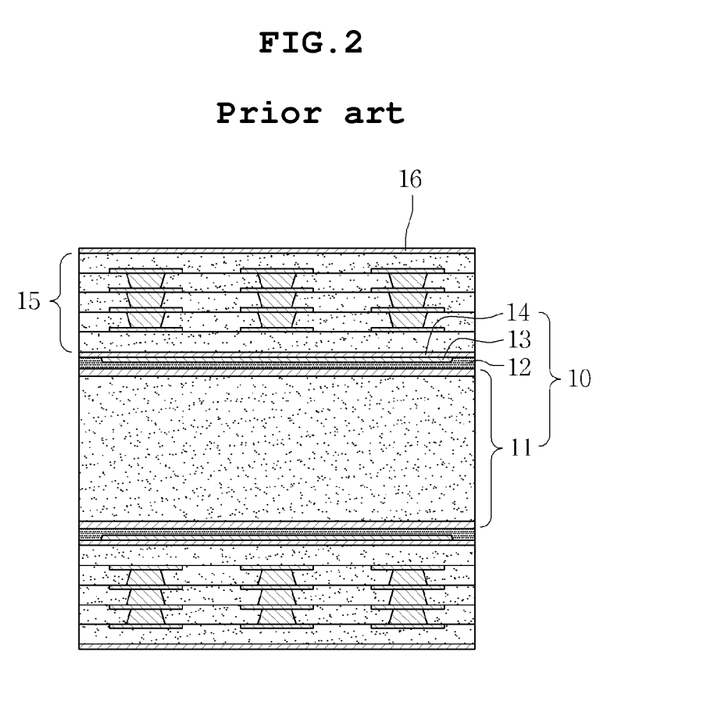

Next, as shown in FIG. 2, a build-up layer 15 is formed on both surfaces of the carrier 10, and a third metal layer 16 is formed on the outermost insulating layer of the build-up layer 15. Here, the build-up layer 15 may be formed by a method which is typically known in the art, and may be additionally provided with vias for connecting build-up circuit layers thereof. Furthermore, the third metal layer 16 may be provided in order to prevent the warping of the build-up layer 15.

Figure 3:
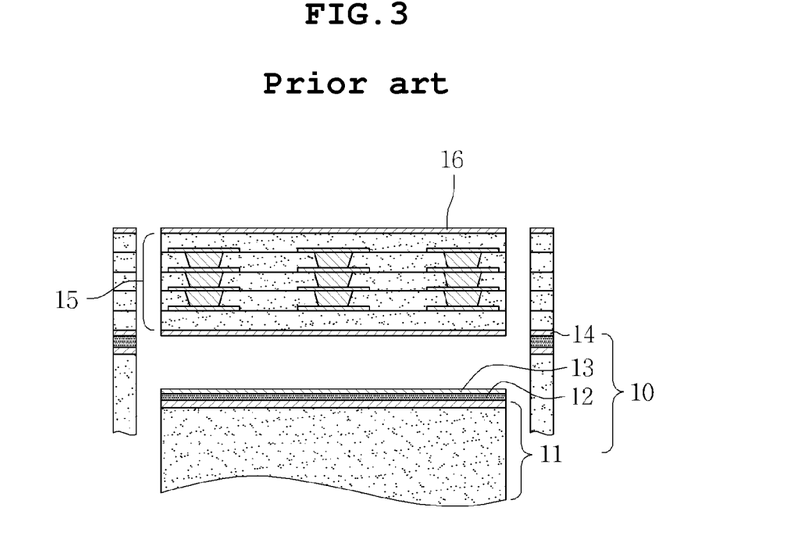

Next, as shown in FIG. 3, the build-up layer 15 is separated from the carrier 10. As such, both ends of the adhesive layer 12, which are adhered to the copper clad laminate 11 and the second metal layer 14, may be removed by a routing process, thereby separating the build-up layer 15 from the carrier 10. The first metal layer 13, which functions as a release layer, is easily separated from the second metal layer 14 after removal of the adhesive layer 12, because the first metal layer 13 is not adhered to the second metal layer 14.

Figure 4:
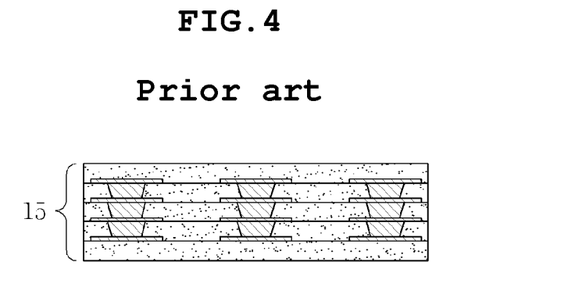

Next, as shown in FIG. 4, the second metal layer 14 and the third metal layer 16 are removed from the build-up layer 15 by etching.

Figure 5:
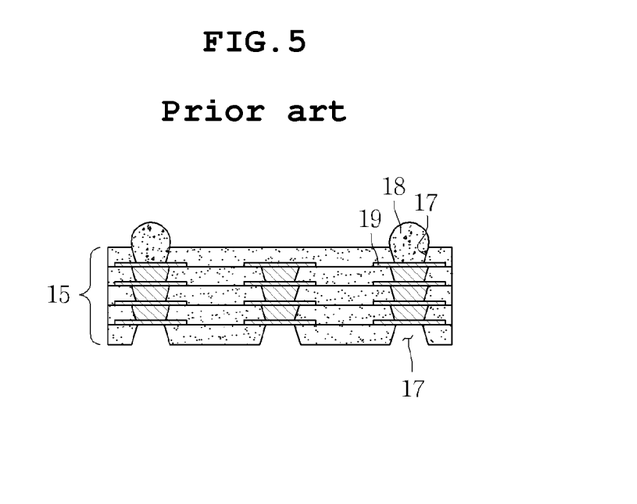

Next, as shown in FIG. 5, openings 17 for exposing pads 19 of the outermost circuit layer of the build-up layer 15 are formed in the outermost insulating layer of the build-up layer 15, and then solder balls 18 are formed on the pads 19.

However, the conventional method of manufacturing a PCB using a carrier is problematic because a vacuum method is adopted in order to make the bonding of the carrier 10 firm or a release layer is additionally formed in order to facilitate the separation of the carrier 10, undesirably increasing process cost and process time.

SUMMARY OF THE INVENTION

Accordingly, the present invention has been made keeping in mind the problems encountered in the related art and the present invention is intended to provide a carrier for manufacturing a PCB, which is simply configured without the need to perform a vacuum method or to form a release layer thus reducing process cost and process time, a method of manufacturing the same, and a method of manufacturing a PCB using the same.

An aspect of the present invention provides a carrier for manufacturing a PCB, including a first carrier including a first binder having a first opening and a first metal layer formed in the first opening of the first binder, and a second carrier stacked with the first carrier and including a second binder having a second opening and a second metal layer which is formed in the second opening of the second binder and which partially overlaps with the first metal layer.

In this aspect, on the plane extending from the plane between the first metal layer and the second metal layer which are joined together, the first metal layer may be connected to the second binder, and the second metal layer may be connected to the first binder.

In this aspect, the first binder and the second binder may be a frame made of a prepreg.

In this aspect, the first metal layer and the second metal layer may be made of a light metal.

Another aspect of the present invention provides a method of manufacturing the carrier for manufacturing a PCB, including (A) forming a first opening in a first binder, and disposing a first metal layer in the first opening, thus preparing a first carrier, (B) forming a second opening in a second binder, and disposing a second metal layer in the second opening, thus preparing a second carrier, and (C) stacking the first carrier and the second carrier such that the first metal layer and the second metal layer partially overlap with each other.

In this aspect, in (C), on the plane extending from the plane between the first metal layer and the second metal layer which are joined together, the first metal layer may be connected to the second binder, and the second metal layer may be connected to the first binder.

In this aspect, the method may further include (D) curing the first binder and the second binder, which are joined together, using heat and pressure.

In this aspect, the first binder and the second binder may be a frame made of a prepreg.

In this aspect, the first metal layer and the second metal layer may be made of a light metal.

In this aspect, the first opening and the second opening may be formed by a routing process.

A further aspect of the present invention provides a method of manufacturing a PCB using the carrier, including (A) preparing the carrier by disposing a first metal layer in a first opening of a first binder thus preparing a first carrier, disposing a second metal layer in a second opening of a second binder thus preparing a second carrier, and stacking the first carrier and the second carrier such that the first metal layer and the second metal layer partially overlap with each other, (B) forming a build-up layer on the carrier, and (C) vertically cutting an inside of a region where the first metal layer and the second metal layer overlap with each other thus separating the first metal layer and the second metal layer from each other, and removing the first metal layer and the second metal layer.

In this aspect, in (A), on the plane extending from the plane between the first metal layer and the second metal layer which are joined together, the first metal layer may be connected to the second binder, and the second metal layer may be connected to the first binder.

In this aspect, (A) may include (A1) disposing a first metal layer in a first opening of a first binder, thus preparing a first carrier, (A2) disposing a second metal layer in a second opening of a second binder, thus preparing a second carrier, (A3) stacking the first carrier and the second carrier such that the first metal layer and the second metal layer partially overlap with each other, and (A4) curing the first binder and the second binder, which are joined together, using heat and pressure.

In this aspect, in (A), the first binder and the second binder may be a frame made of a prepreg.

In this aspect, the first metal layer and the second metal layer may be made of a light metal.

In this aspect, in (A), the first opening and the second opening may be formed by a routing process.

In this aspect, (C) may include (C1) vertically cutting an inside of a region when the first metal layer and the second metal layer overlap with each other using a routing process, thus separating the first metal layer and the second metal layer from each other, and (C2) removing the first metal layer and the second metal layer using etching.

BRIEF DESCRIPTION OF THE DRAWINGS

The features and advantages of the present invention will be more clearly understood from the following detailed description taken in conjunction with the accompanying drawings, in which:

FIGS. 7A and 7B to 9A and 9B are cross-sectional views and top plan views sequentially showing a process of manufacturing the carrier of FIGS. 6A and 6B.

DESCRIPTION OF SPECIFIC EMBODIMENTS

Hereinafter, embodiments of the present invention will be described in detail while referring to the accompanying drawings. Throughout the drawings, the same reference numerals are used to refer to the same or similar elements. In the description, the terms "first", "second" and so on are used to distinguish one element from another element, and the elements are not defined by the above terms. Moreover, descriptions of known techniques, even if they are pertinent to the present invention, are regarded as unnecessary and may be omitted when they would make the characteristics of the invention and the description unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Carrier for Manufacturing PCB

Figure 6:
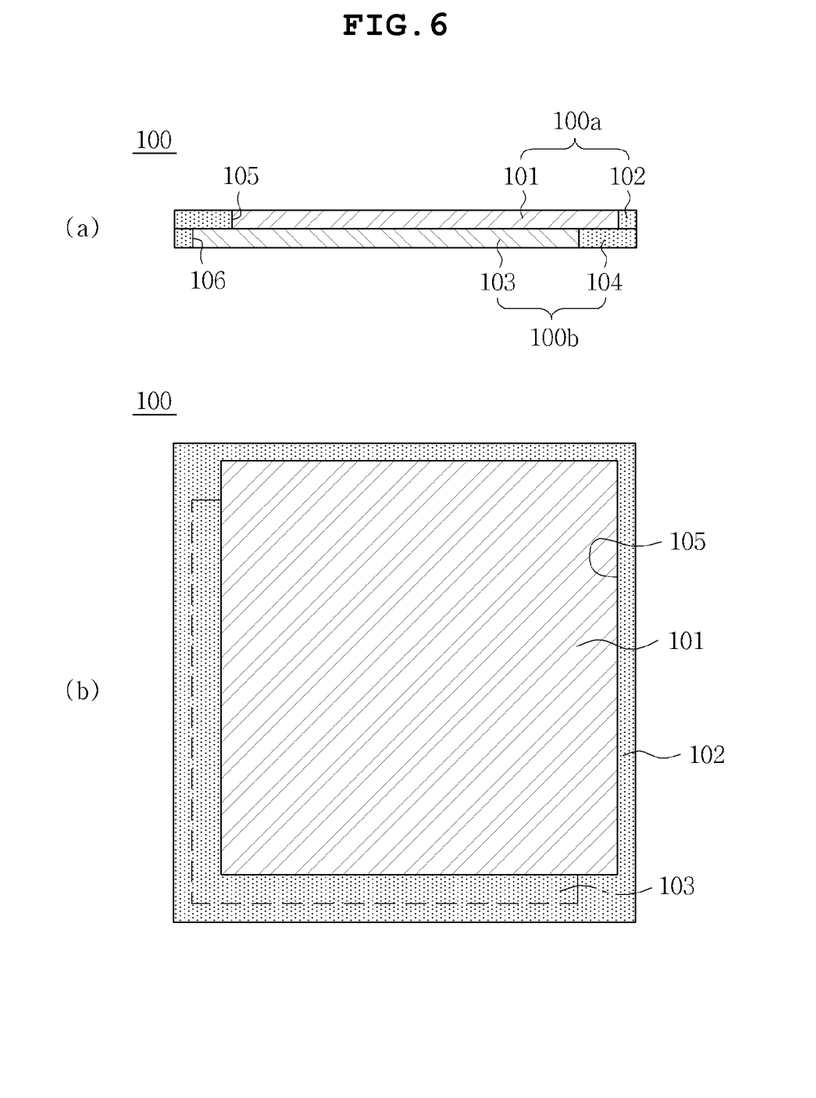
FIGS. 6A and 6B are respectively a cross-sectional view and a top plan view showing a carrier for manufacturing a PCB, according to an embodiment of the present invention.
Figure 7:
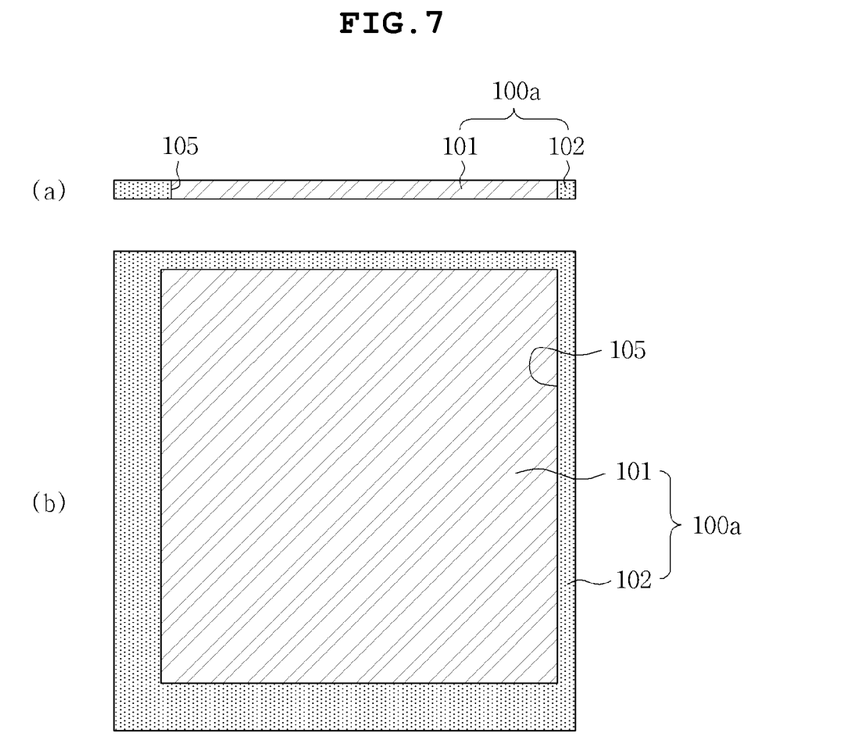
Figure 8:
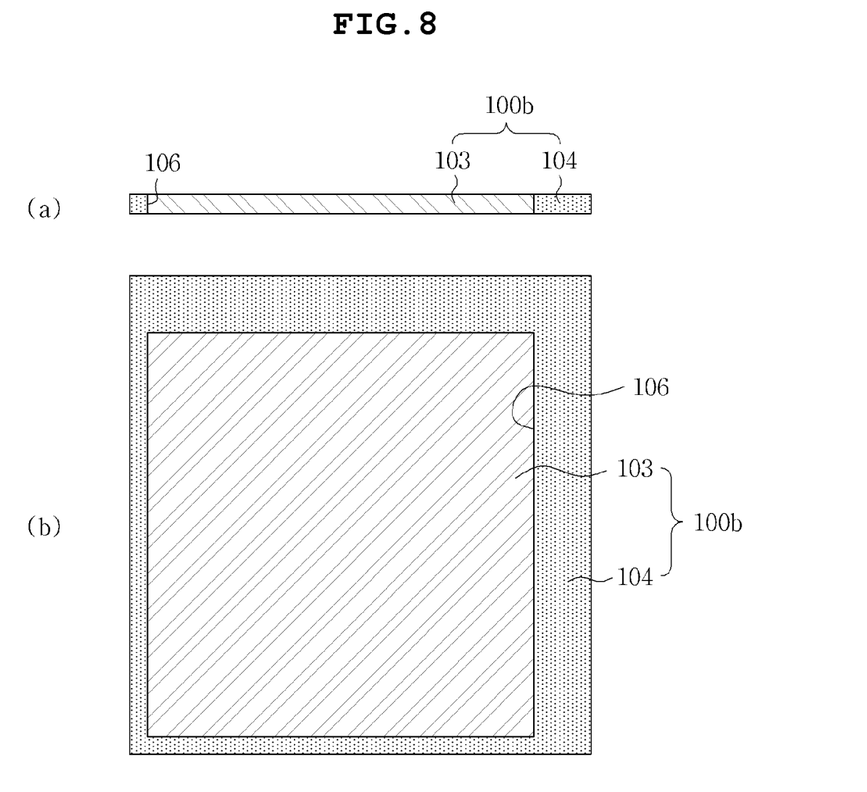
Figure 9:
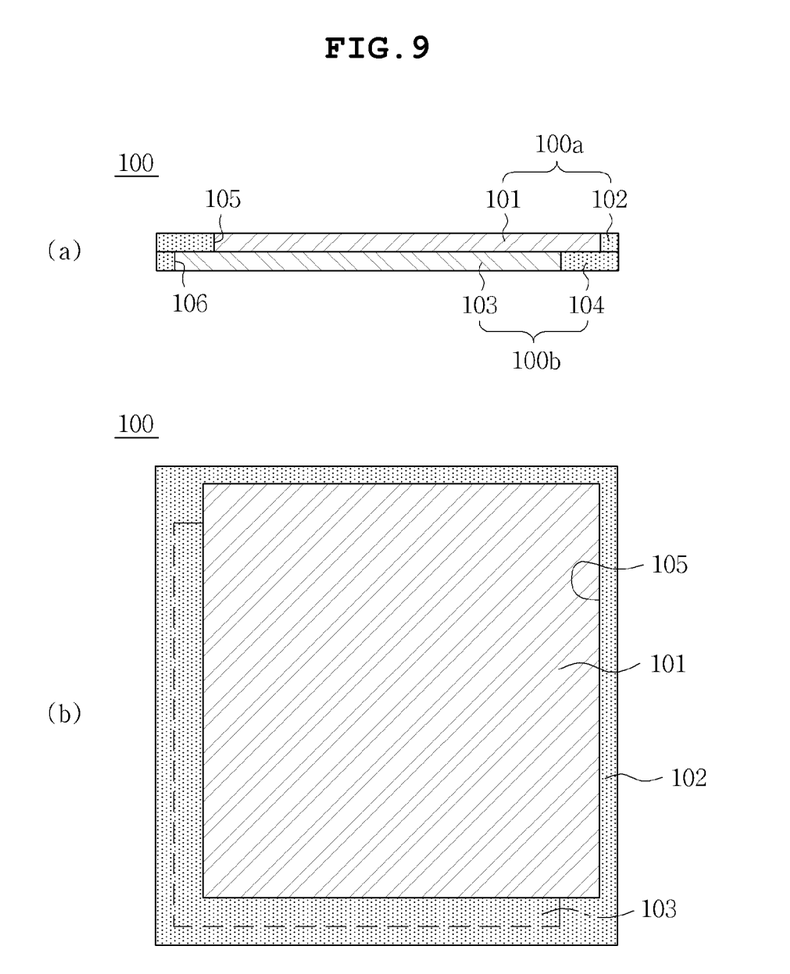

FIGS. 6A and 6B are respectively a cross-sectional view and a top plan view showing a carrier for manufacturing a PCB according to an embodiment of the present invention. With reference to these drawings, the carrier 100 for manufacturing a PCB according to the embodiment of the present invention is described infra.

As shown in FIGS. 6A and 6B, the carrier 100 for manufacturing a PCB according to the present embodiment includes a first carrier 100a consisting of a first binder 102 and a first metal layer 101, and a second carrier 100b consisting of a second binder 104 and a second metal layer 103, in which the first metal layer 101 and the second metal layer 102 are disposed so as to partially overlap with each other.

The first carrier 100a is a member consisting of the first binder 102 and the first metal layer 101, and is stacked on the second carrier 100b, thus constituting the carrier 100.

The first binder 102 includes a first opening 105 formed therein so that the first metal layer 101 is positioned in the first opening 105. The first binder 102 may hold the first metal layer 101 along with the second binder 104 which will be described later. The first binder 102 may be provided in the form of for example a frame made of a prepreg.

The first metal layer 101 is positioned in the first opening 105 of the first binder 102, and is held by the first binder 102 and the second binder 104. As such, the first metal layer 101 may be made of light metal such as aluminum, magnesium, duralumin and so on. If the light metal is not used, the carrier 100 may warp due to the weight of the build-up layer 110 and the self-weight of the first metal layer 101 in the PCB manufacturing process.

The second carrier 100b is a member consisting of the second binder 104 and the second metal layer 103, and is stacked with the first carrier 100a and thus constitutes the carrier 100. Herein, the second binder 104 and the second metal layer 103 may have the same features as in the first binder 102 and the first metal layer 101, and the description thereof is omitted.

The first carrier 100a and the second carrier 100b are stacked such that the first metal layer 101 and the second metal layer 103 partially overlap with each other.

Specifically, on the plane extending from the plane between the first metal layer 101 and the second metal layer 103 which are joined together, the first metal layer 101 is connected to the second binder 104 and the second metal layer 103 is connected to the first binder 102. That is, the binders 102, 104 located at both sides of the metal layers 101, 103 may be provided to have the sections of character 'L' that is clockwise rotated by 90 degrees and character 'L' that is counterclockwise rotated by 90 degrees.

When the first metal layer 101 and the second metal layer 103 are joined together so as to partially overlap with each other, the binders 102, 104 are connected not only to the lateral surfaces of the metal layers 101, 103 but also to the upper surfaces thereof, thus enhancing the force of holding the metal layers 101, 103 and improving reliability of the carrier 100 at the periphery. Also, the binders 102, 104 are configured so as to enclose the lateral surfaces of the metal layers 101, 103, thus preventing the penetration of external impurities such as an etchant into the carrier 100.

The portions of the first metal layer 101 and the second metal layer 102, which overlap with each other, are only in contact with each other, and may not be adhered to each other.

Method of Manufacturing Carrier for Manufacturing PCB

FIGS. 7A and 7B to 9A and 9B sequentially show the process of manufacturing the carrier 100 according to the embodiment of the present invention. With reference to FIGS. 7A and 7B to 9A and 9B, the method of manufacturing the carrier 100 according to the embodiment of the present invention is described infra.

As shown in FIGS. 7A and 7B, a first opening 105 is formed in a first binder 102, and a first metal layer 101 is positioned in the first opening 105, thus preparing a first carrier 100a.

The first binder 102 may be in a semi-cured state to the extent of having a frame form. In the case where the first binder 102 is in a non-cured state, its fluidity is increased thus making it difficult to form the first opening 105. On the other hand, in the case where the first binder 102 is in a completely cured state, the force of bonding of the first binder 102 may be decreased upon subsequent stacking of the first carrier 100a on a second carrier 100b.

The first opening 105 of the first binder 102 may be formed by for example a routing process. As such, the size of the first opening 105 may be equal to or slightly larger than the size of the first metal layer 101. Even when the size of the first opening 105 is slightly larger than the size of the first metal layer 101, the first metal layer 101 may be held upon subsequent curing of the first binder 102 and the second binder 104.

Next, as shown in FIGS. 8A and 8B, a second opening 106 is formed in a second binder 104 and a second metal layer 103 is positioned in the second opening 106, thus preparing the second carrier 100b.

As such, the second binder 104 may be in a semi-cured state having a frame form, and the second opening 106 may be formed by a routing process.

Next, as shown in FIGS. 9A and 9B, the first carrier 100a and the second carrier 100b are stacked.

As such, the first carrier 100a and the second carrier 100b are stacked so that the first metal layer 101 and the second metal layer 103 partially overlap with each other. Furthermore, the first metal layer 101 may be connected to the second binder 104, and the second metal layer 103 may be connected to the first binder 102.

After the first carrier 100a and the second carrier 100b are stacked, the first binder 102 and the second binder 104 may be cured under heat and pressure. Hence, the force of joining between the first carrier 100a and the second carrier 100b may be enhanced.

Thereby, the carrier 100 shown in FIGS. 9A and 9B according to the present embodiment may be manufactured.

Method of Manufacturing PCB Using the Carrier

FIGS. 10 to 14 are cross-sectional views sequentially showing a process of manufacturing a PCB 200 using the carrier according to the embodiment of the present invention. With reference to FIGS. 10 to 14, the method of manufacturing a PCB 200 using the carrier according to the embodiment of the present invention is described infra.

In the present embodiment, the case where the PCB 200 is formed on both surfaces of the carrier 100 is illustratively shown, but the present invention is not limited thereto, and the case where the PCB 200 is formed on either surface of the carrier 100 is possible.

Figure 10:
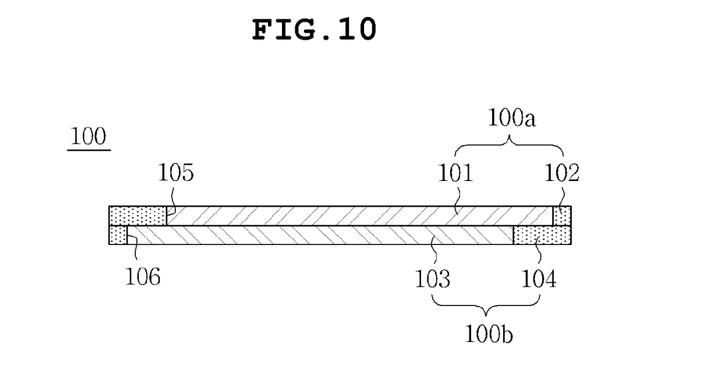
FIGS. 10 to 14 are cross-sectional views sequentially showing a process of manufacturing a PCB using the carrier according to the embodiment of the present invention.

As shown in FIG. 10, the carrier 100 is prepared by positioning a first metal layer 101 in a first opening 105 of a first binder 102 thus preparing a first carrier 100a, positioning a second metal layer 103 in a second opening 106 of a second binder 104 thus a second carrier 100b, and stacking the first carrier 100a and the second carrier 100b such that the first metal layer 101 and the second metal layer 103 partially overlap with each other, thus preparing the carrier 100.

Figure 11:
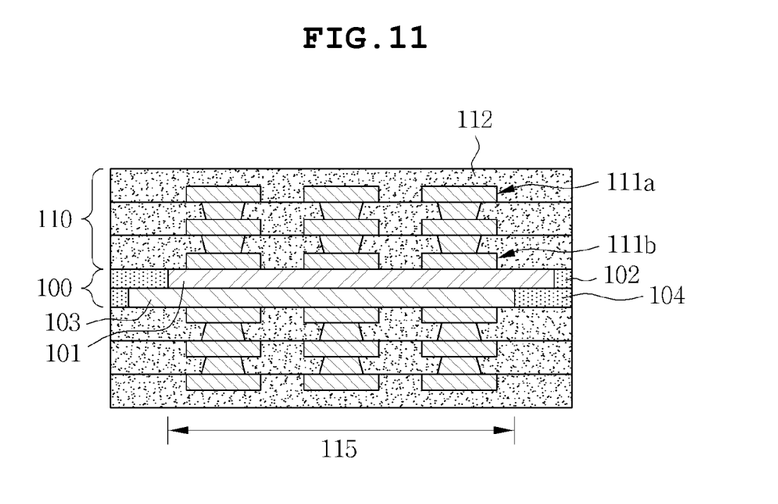

Next, as shown in FIG. 11, a build-up layer 110 is formed on the carrier 100.

As such, the build-up layer 110 may be composed of pluralities of build-up insulating layers and build-up circuit layers, and may be formed using a typical process. For example, the build-up circuit layers may be formed using a subtractive process, an additive process, a semi-additive process, or a modified semi-additive process. Also, the build-up circuit layers may be connected using vias. FIG. 11 illustrates the build-up layer 110 composed of three layers, but the build-up layer may be provided in the form of a single layer or a multilayer.

The outermost insulating layer 112 of the build-up layer 110 may be formed of for example a dry film type solder resist so as to protect the outermost circuit layer 111a at one side of the build-up layer 110.

Figure 12:
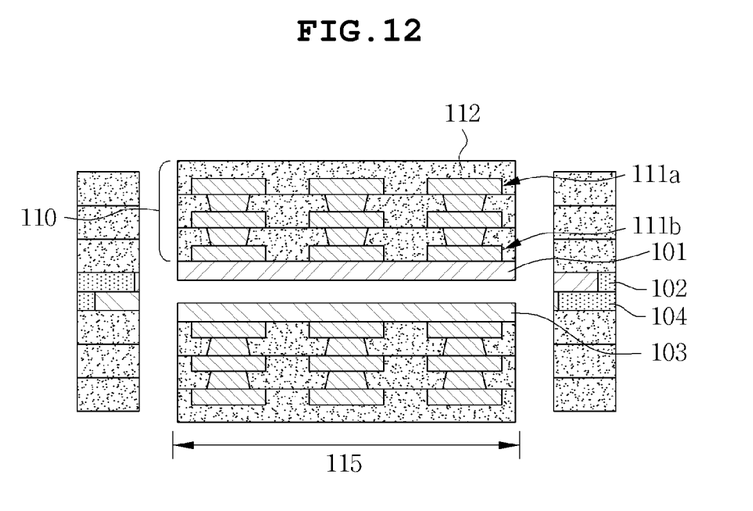

Next, as shown in FIG. 12, the inside of the region 115 where the first metal layer 101 and the second metal layer 103 overlap with each other is vertically cut, so that the first metal layer 101 and the second metal layer 103 are separated from each other.

As such, when the inside of the region 115 where the first metal layer 101 and the second metal layer 103 overlap with each other is cut in this way, the first metal layer 101 and the second metal layer 103, which are not adhered to each other, may be separated from each other. Upon cutting, the first binder 102 and the second binder 104 for holding the first metal layer 101 and the second metal layer 103 are removed, and thus the first metal layer 101 and the second metal layer 103 may be easily separated from each other.

When the inside of the region 115 where the first metal layer 101 and the second metal layer 103 overlap with each other is vertically cut, for example, a routing process may be applied.

Figure 13:
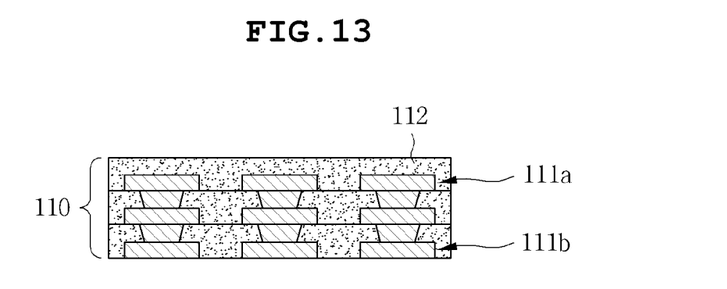

Next, as shown in FIG. 13, the first metal layer 101 and the second metal layer 103 are removed from the build-up layer 110.

As such, the first metal layer 101 and the second metal layer 103 may be removed using for example an etching process. Furthermore, when the first metal layer 101 and the second metal layer 103 are removed, the outermost circuit layer 111b at the other side of the build-up layer 110 may be exposed externally, and the outermost circuit layer 111b is buried in the build-up insulating layer thus obviating the need for an additional solder resist layer.

In the case when the first metal layer 101 and the second metal layer 103 are made of light metal, the outermost circuit layer 111b at the other side of the build-up layer 110 is typically formed of copper. Even when the first metal layer 101 and the second metal layer 103 are etched, the outermost circuit layer 111b at the other side of the build-up layer 110 may not react with an etchant.

Figure 14:
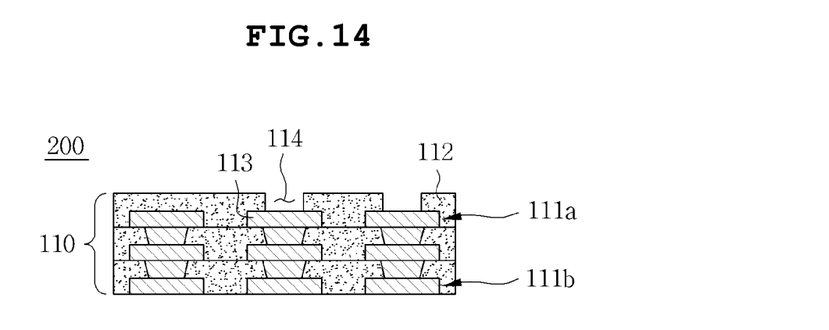

Next, as shown in FIG. 14, openings 114 are formed on the outermost insulating layer 112 of the build-up layer 110.

As such, the openings 114 for exposing the pads 113 of the outermost circuit layer 111a at one side of the build-up layer 110 may be formed on the outermost insulating layer 112 of the build-up layer 110. Furthermore, additional solder balls (not shown) are formed on the pads 113 so as to form a connection to an external device. Also, the openings 114 may be formed using for example a laser process or a drilling process.

Also, a solder resist layer for protecting the outermost circuit layer 111b at the other side of the build-up layer 110 may be additionally formed, and openings for exposing the pads of the outermost circuit layer 111b may be further formed.

Thereby, the PCB 200 shown in FIG. 14 is manufactured using the carrier according to the embodiment of the present invention.

In the present embodiment, the case where the circuit layer of the build-up layer 110 may be first formed on the carrier 110 is described, but the present invention is not limited, and the case where the insulating layer is first formed is possible.

As described hereinbefore, the present invention provides a carrier for manufacturing a PCB, a method of manufacturing the same and a method of manufacturing a PCB using the same. According to the present invention, the carrier is simply configured using two metal layers and two binders, thus reducing the process cost and process time.

Also, according to the present invention, the first and second metal layers are formed of light metal, thus preventing the warping of the carrier due to the weight of PCB and the self-weight of the first and second metal layers.

Also, according to the present invention, the first and second carriers are stacked such that the first and second metal layers partially overlap with each other thus manufacturing the carrier. Thereby, the binders are formed not only on the lateral surfaces of the metal layers but also on the upper surfaces thereof, thus improving reliability of the carrier at the periphery.

Also, according to the present invention, the binders are formed on the lateral surfaces of the metal layers thus preventing the penetration of impurities into the carrier.

Although the embodiments of the present invention regarding the carrier for manufacturing a PCB, the method of manufacturing the same and the method of manufacturing a PCB using the same have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A method of manufacturing a carrier for manufacturing a printed circlet board, comprising:

(A) forming a first opening in a first binder, and disposing a first metal layer in the first opening, thus preparing a first carrier;

(B) forming a second opening in a second binder, and disposing a second metal layer in the second opening, thus preparing n second carrier; and (C) stacking the first carrier and the second carrier such that the first metal layer and the second metal layer partially overlap with each other, wherein, in (C), on a plane extending from a plane between the first metal and the second metal layer which are joined together, the first metal layer is connected to the second binder, and the second metal layer is connected to the first binder, the method further comprising:

(D) curing the first binder and the second binder, which are joined together, using heat and pressure.

2. The method as set forth in claim 1, wherein the first binder and the second binder are a frame made of a prepreg.

3. The method as set forth in claim 1, wherein the first metal layer and the second metal layer are made of a light metal.

4. The method as set forth in claim 1 wherein the first opening and the second opening are formed by a routing process.

5. A method of manufacturing a printed circuit board using a carrier, comprising:

(A) preparing the carrier by disposing a first metal layer in a first opening of a first binder thus preparing a first carrier, disposing a second metal layer in a second opening of a second binder thus preparing a second carrier, and stacking the first carrier and the second carrier such that the first metal layer and the second metal layer partially overlap with each other, wherein in (A), on a plane extending from a plane between the first metal layer and the second metal layer which are joined together, the first metal layer is connected to the second binder, and the second metal layer is connected to the first binder;

(B) forming a build-up layer on the carrier; and (C) vertically cutting an inside nm a region where the first metal layer, which is not connected to the second binder, and the second metal layer, which not connected to the first binder, overlap with each other thus separating the cut first metal layer and second metal layer from each other, and removing the separated first metal layer and second metal layer from the build-up layer.

6. The method as set forth in claim 5, wherein (A) comprises:

(A1) disposing a first metal layer in a first opening of a first binder, thus preparing a first carrier;

(A2) disposing a second metal layer in a second opening of a second binder, thus preparing a second carrier;

(A3) stacking the first carrier and the second carrier such that the first metal layer and the second metal layer partially overlap with each other; and (A4) curing the first binder and the second binder, which are joined together, using heat and pressure.

7. The method as set forth in claim 5, wherein in (A) the first binder and the second binder are a frame made of a prepreg.

8. The method as set forth in claim 5, wherein the first metal layer and the second metal layer are made of a light metal.

9. The method as set forth in claim 5, wherein in (A) the first opening and the second opening are formed by a routing process.

10. The method as set forth in claim 5, wherein (C) comprises:

(C1) vertically cutting an inside of a region where the first metal layer, which is not connected to the second binder, and the second metal layer, which is not connected to the first binder, overlap with each other using a routing process, thus separating the cut first meta layer and second metal layer front each other; and (C2) removing the separated first metal layer and second metal layer from the build-up layer, using etching.

\* \* \* \* \*